(12) United States Patent
Koudate

(10) Patent No.: US 9,900,010 B2
(45) Date of Patent: *Feb. 20, 2018

(54) LEVEL SHIFTER

(71) Applicant: Renesas Electronics Corporation, Tokyo (JP)

(72) Inventor: Kazuhiro Koudate, Tokyo (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/357,903

(22) Filed: Nov. 21, 2016

(65) Prior Publication Data
US 2017/0070227 A1 Mar. 9, 2017

Related U.S. Application Data

(63) Continuation of application No. 14/977,471, filed on Dec. 21, 2015, now Pat. No. 9,515,662, which is a continuation of application No. 14/331,009, filed on Jul. 14, 2014, now Pat. No. 9,225,330.

(30) Foreign Application Priority Data

Aug. 7, 2013 (JP) ................. 2013-164319

(51) Int. Cl.
*H03K 19/018* (2006.01)
*H03K 19/0185* (2006.01)
(Continued)

(52) U.S. Cl.
CPC ............... *H03K 19/018521* (2013.01); *H03K 3/356113* (2013.01); *H03K 19/0013* (2013.01);
(Continued)

(58) Field of Classification Search
CPC ........ H03K 5/003; H03K 19/015; G06F 3/00; G06F 3/1295
(Continued)

(56) References Cited

U.S. PATENT DOCUMENTS 7,180,329 B1    2/2007  Sia et al.
7,501,876 B2 *  3/2009  Kimura ............ H03K 19/01852
                                              326/68
(Continued)

OTHER PUBLICATIONS

Wen-Tai Wang et al., "Level Shifters for High-speed 1-V to 3.3-V Interfaces in a 0.13-um Cu-Interconnection/Low-k CMOS Technology", IEEE, 2001, pp. 307-310.

(Continued)

*Primary Examiner* — John Poos
(74) *Attorney, Agent, or Firm* — McGinn IP Law Group, PLLC

(57) ABSTRACT

A level shifter includes a first and a second transistor coupled to a first power supply voltage terminal supplied with a second power supply voltage in parallel, the first transistor having a first gate connected to a drain of the second transistor and a first gate insulating film, and the second transistor having a second gate connected to a drain of the first transistor and a second gate insulating film, a third and a fourth transistor coupled to a reference voltage terminal in parallel, the third transistor having a third gate supplied with a first control signal and a third gate insulating film, and the fourth transistor having a fourth gate supplied with a second control signal and a fourth gate insulating film, a first and a second depression transistor, and a timing control unit placed between a second power supply voltage terminal and the reference voltage terminal.

21 Claims, 12 Drawing Sheets

(51) Int. Cl.
*H03K 19/00* (2006.01)
*H03K 19/0175* (2006.01)
*H03K 3/356* (2006.01)
*H03K 19/003* (2006.01)

(52) U.S. Cl.
CPC ............... *H03K 19/00315* (2013.01); *H03K 19/017509* (2013.01)

(58) Field of Classification Search
USPC .......................................................... 327/333
See application file for complete search history.

(56) References Cited

U.S. PATENT DOCUMENTS

| | | |
|---|---|---|
| 2003/0042965 A1 | 3/2003 | Kanno et al. |
| 2005/0134355 A1 | 6/2005 | Maede et al. |
| 2007/0229137 A1 | 10/2007 | Nishimura |
| 2007/0247209 A1 | 10/2007 | Chen |
| 2008/0054979 A1 | 3/2008 | Naguma |
| 2014/0062573 A1* | 3/2014 | Choung .................. H03K 3/01 327/333 |

OTHER PUBLICATIONS

Extended European Search report dated Jan. 8, 2015.
U.S. Non-Final Office Action dated Apr. 7, 2015 in U.S. Appl. No. 14/331,009.
U.S. Notice of Allowance dated Aug. 28, 2015 in U.S. Appl. No. 14/331,009.
U.S. Non-Final Office Action dated Dec. 21, 2015 in U.S. Appl. No. 14/977,471.
U.S. Notice of Allowance dated Aug. 11, 2016 in U.S. Appl. No. 14/977,471.

* cited by examiner

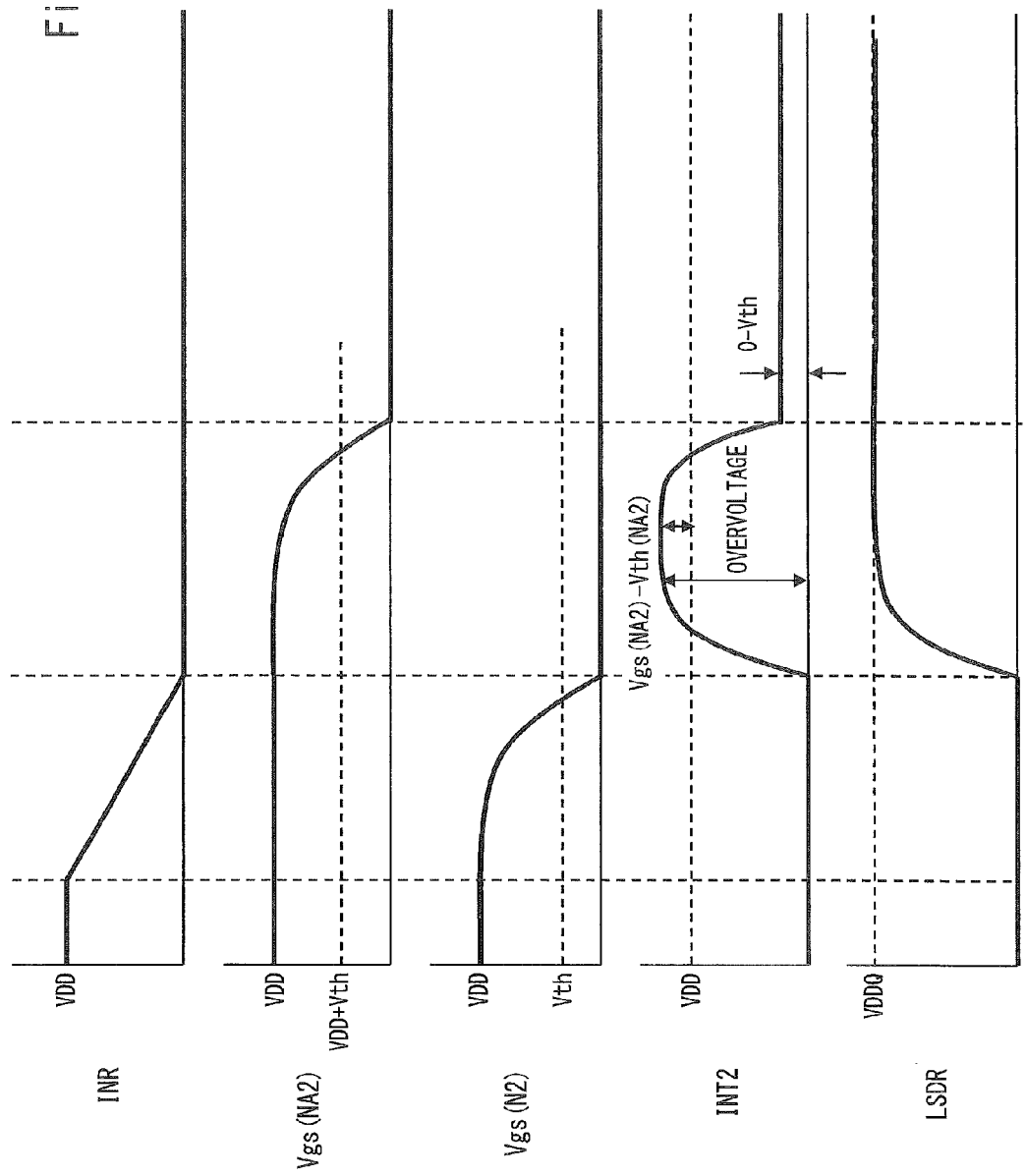

LEVEL SHIFTER

CROSS-REFERENCE TO RELATED APPLICATIONS

The present application is a Continuation application of U.S. patent application Ser. No. 14/977,471, filed on Dec. 21, 2015, which is a Continuation application of U.S. patent application Ser. No. 14/331,009, filed on Jul. 14, 2014, now U.S. Pat. No. 9,225,330, issued on Dec. 29, 2015, which is based on Japanese Patent Application No. 2013-164319, filed on Aug. 7, 2013, the entire contents of which are hereby incorporated by reference.

BACKGROUND

The present invention relates to a level shifter and, for example, relates to a level shifter suitable for a high-speed operation.

The internal voltage of a semiconductor device becomes lower upon a reduction in power consumption. Accordingly, a voltage difference between the internal voltage and the external voltage of the semiconductor device increases. A level shifter that serves as an interface between the inside and the outside of the semiconductor device is required to achieve a high-speed operation without degrading reliability even when a voltage difference between an input voltage and an output voltage is large.

As a related technique, a level shifter that can achieve a high-speed operation is disclosed in "Wen-Tai Wang et al., "Level Shifters for High-speed 1-V to 3.3-V Interfaces in a 0.13-um Cu-Interconnection/Low-k CMOS Technology", IEEE, 2001, pp 307-310".

SUMMARY

The present inventor has found the following problem. In the level shifter disclosed by Wen-Tai Wang et al., there is a possibility of a voltage exceeding a withstand voltage being applied to a low breakdown voltage MOS transistor used in the level shifter. This causes breakdown and deterioration of the low breakdown voltage MOS transistor, which degrades the reliability of the level shifter. Other problems to be solved and novel features of the present invention will become apparent from the description of the specification and the accompanying drawings.

According to one embodiment, a level shifter includes high breakdown voltage first and second PMOS transistors, high breakdown voltage first and second depression NMOS transistors having gates respectively supplied with first and second control signals, low breakdown voltage first and second NMOS transistors having gates respectively supplied with third and fourth control signals, and a timing control unit that generates the first control signal and the third control signal different from the first control signal corresponding to an inverted signal of an input signal and generates the second control signal and the fourth control signal different from the second control signal corresponding to a non-inverted signal of the input signal.

According to the above-described embodiment, it is possible to provide a level shifter that can achieve a high-speed operation without degrading reliability.

BRIEF DESCRIPTION OF THE DRAWINGS

The above and other aspects, advantages and features will be more apparent from the following description of certain embodiments taken in conjunction with the accompanying drawings, in which:

FIG. 12 is a timing chart showing an operation of a level shifter according to related art.

DETAILED DESCRIPTION

<Studies by the Inventors>

Before describing a level shifter according to this embodiment, studies on related art conducted by the present inventor will be described.

Figure 11:
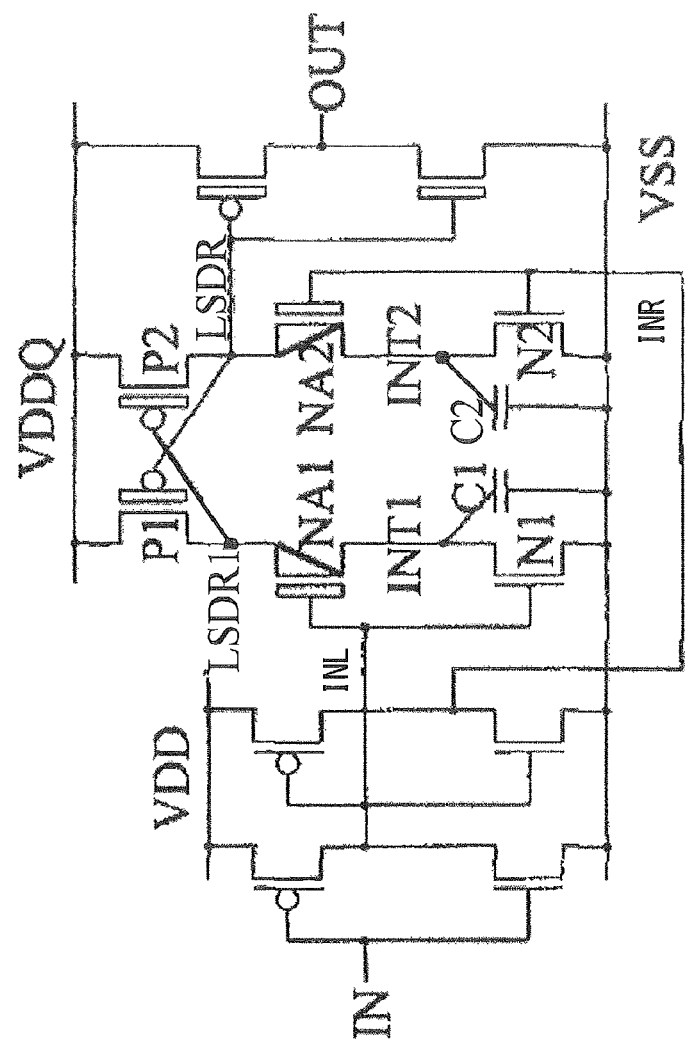
FIG. 11 is a diagram showing a configuration of a level shifter according to related art.

FIG. 11 is a diagram showing the configuration of the level shifter according to the related art disclosed in "Wen-Tai Wang et al., "Level Shifters for High-speed 1-V to 3.3-V Interfaces in a 0.13-um Cu-Interconnection/Low-k CMOS Technology", IEEE, 2001, pp 307-310". The level shifter shown in FIG. 11 includes high breakdown voltage PMOS transistors P1 and P2, high breakdown voltage depression NMOS transistors NA1 and NA2, and low breakdown voltage NMOS transistors N1 and N2.

Note that the high breakdown voltage MOS transistor is a MOS transistor that does not fail until a voltage between two terminals among a source, drain and gate reaches a high-voltage power supply voltage VDDQ. The low breakdown voltage MOS transistor is a MOS transistor that does not fail until a voltage between two terminals among a source, drain and gate reaches a low-voltage power supply voltage VDD. The high breakdown voltage MOS transistor has a thicker gate insulating film compared with the low breakdown voltage MOS transistor, for example. Further, the depression MOS transistor is also called a native MOS transistor or a 0-Vth MOS transistor. Note that a threshold voltage Vth of the depression MOS transistor is about 0V to −0.several V.

The level shifter shown in FIG. 11 includes the low breakdown voltage NMOS transistors N1 and N2 as transistors to receive low voltage Input signals INL and INR. Therefore, even when a voltage level of the power supply voltage VDD is low or a voltage difference between the power supply voltages VDD and VDDQ is large, a high-speed level shift operation Is possible. Further, the level shifter shown in FIG. 11 includes the high breakdown voltage depression NMOS transistors NA1 and NA2 between the low breakdown voltage NMOS transistors N1 and N2 and a power supply voltage terminal to which the high-voltage power supply voltage VDDQ is supplied. A voltage at nodes INT1 and INT2 is thereby kept low, and consequently a voltage exceeding a withstand voltage is not applied to the low breakdown voltage NMOS transistors N1 and N2. This reduces degradation of the low breakdown voltage NMOS transistors N1 and N2.

However, the inventor has found that there is a case where a voltage exceeding a withstand voltage is applied to the low breakdown voltage NMOS transistors N1 and N2 of the level shifter shown in FIG. 11.

FIG. 12 is a timing chart to describe a problem of the level shifter in the related art. For example, when the input signal IN rises from L level (reference voltage VSS) to H level (power supply voltage VDD), an inverted signal INR of the input signal falls from H level to L level accordingly. A gate voltage of the high breakdown voltage depression NMOS transistor NA2 and a gate voltage of the low breakdown voltage NMOS transistor N2 thereby fall from H level to L level at the same time.

In general, a response speed of a low breakdown voltage MOS transistor is higher than a response speed of a high breakdown voltage MOS transistor. Accordingly, a response speed of the low breakdown voltage NMOS transistor N2 is higher than a response speed of the high breakdown voltage depression NMOS transistor NA2. Therefore, there is a possibility that on-resistance of the high breakdown voltage depression NMOS transistor NA2 will not become high enough at the time when the low breakdown voltage NMOS transistor N2 turns off. In this case, a voltage at the node INT2 becomes high, and thereby a voltage exceeding a withstand voltage is applied to the low breakdown voltage NMOS transistor N2. For example, when the threshold voltage Vth of the high breakdown voltage depression NMOS transistor NA2 is −0.5V and the power supply voltage VDD is 1.0V, the voltage at the node INT2 is as high as VDD−Vt=1.5V, and therefore a voltage exceeding a withstand voltage is applied to the low breakdown voltage NMOS transistor N2. This causes degradation of the low breakdown voltage NMOS transistor N2. As a result, the reliability of the level shifter is lowered.

Embodiments of the present invention are described hereinafter with reference to the drawings. It should be noted that the drawings are given in a simplified form by way of illustration only, and thus are not to be considered as limiting the present invention. The same elements are denoted by the same reference symbols, and redundant explanations are omitted.

In the following embodiments, the description will be divided into a plurality of sections or embodiments when necessary for the sake of convenience. However, unless explicitly specified otherwise, those sections or embodiments are by no means unrelated to each other, but are in such a relation that one represents a modification, a detailed or supplementary description, etc. of part or whole of the other. Further, in the following embodiments, when a reference is made to the number etc, (including the number, numeric value, quantity, range, etc.) of elements, except in such cases where it is explicitly specified otherwise or the number is obviously limited to a specific number in principle, the number is not limited to the specific number but may be greater or less than the specific number.

It is needless to mention that, in the following embodiments, their constituent elements (including operation steps) are not necessarily essential, except in such cases where it is explicitly specified otherwise or they are obviously considered to be essential in principle. Likewise, in the following embodiments, when a reference is made to the shape, relative position, etc. of a constituent element or the like, this includes those shapes etc. substantially resembling or similar to that shape etc., except in such cases where it is explicitly specified otherwise or it is obviously considered otherwise in principle. The same applies to the number etc, (including the number, numeric value, quantity, range, etc.) mentioned above.

First Embodiment

Figure 1:
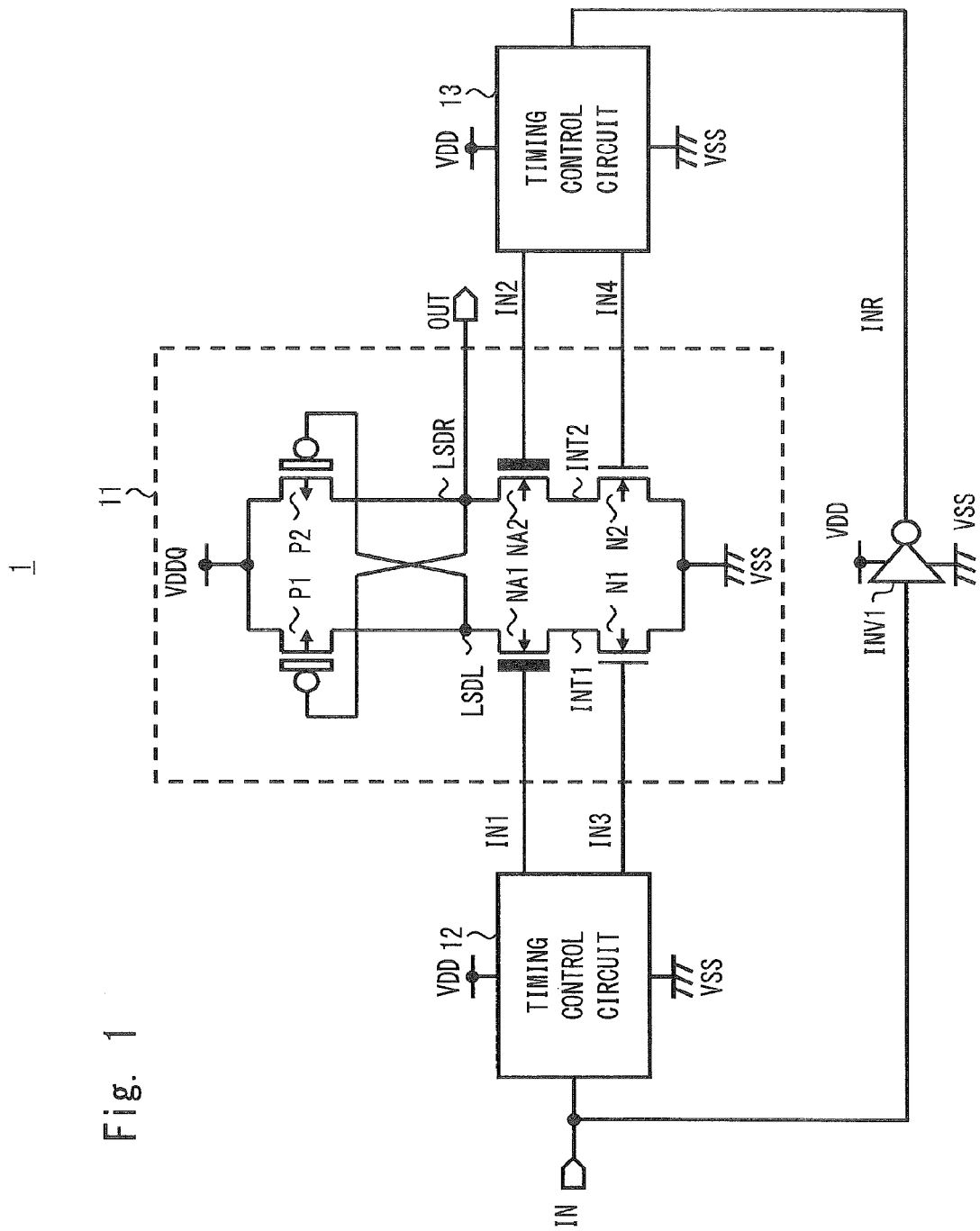
FIG. 1 is a diagram showing a configuration example of a level shifter according to a first embodiment.

FIG. 1 is a diagram showing a configuration example of a level shifter 1 according to a first embodiment. The level shifter 1 according to this embodiment controls the conduction states of the low breakdown voltage NMOS transistor and the high breakdown voltage depression NMOS transistor with different control signals and thereby prevents a voltage exceeding a withstand voltage being applied to the low breakdown voltage NMOS transistor. This reduces degradation of the low breakdown voltage NMOS transistor. The level shifter 1 according to this embodiment can thereby achieve a high-speed operation without degrading reliability.

The level shifter 1 shown in FIG. 1 includes a level shift unit 11, a timing control circuit (first timing control circuit) 12, a timing control circuit (second timing control circuit) 13, and an inverter INV1. Note that the timing control circuits 12 and 13 and the inverter INV1 constitute a timing control unit.

The level shift unit 11 includes a high breakdown voltage PMOS transistor (first PMOS transistor) P1, a high breakdown voltage PMOS transistor (second PMOS transistor) P2, a high breakdown voltage depression NMOS transistor (first depression NMOS transistor) NA1, a high breakdown voltage depression NMOS transistor (second depression NMOS transistor) NA2, a low breakdown voltage NMOS transistor (first NMOS transistor) N1, and a low breakdown voltage NMOS transistor (second NMOS transistor) N2.

The high breakdown voltage PMOS transistors P1 and P2 are placed in parallel between a power supply voltage terminal to which a high-voltage power supply voltage VDDQ is supplied (first power supply voltage terminal; which is referred to hereinafter as a power supply voltage terminal VDDQ) and a reference voltage terminal VSS, and the gate of each transistor is connected to the drain of the other transistor.

To be more specific, in the high breakdown voltage PMOS transistor P1, the source is connected to the power supply voltage terminal VDDQ, the drain is connected to a node LSDL, and the gate is connected to a node LSDR. In the high breakdown voltage PMOS transistor P2, the source is connected to the power supply voltage terminal VDDQ, the drain is connected to the node LSDR, and the gate is connected to the node LSDL.

The high breakdown voltage depression NMOS transistors NA1 and NA2 are placed between the high breakdown voltage PMOS transistors P1 and P2 and the reference voltage terminal VSS, respectively.

To be more specific, in the high breakdown voltage depression NMOS transistor NA1, the source is connected to the node INT1, the drain is connected to the node LSDL, and a control signal (first control signal) IN1 is supplied to the gate. In the high breakdown voltage depression NMOS transistor NA2, the source is connected to the node INT2, the drain is connected to the node LSDR, and a control signal (second control signal) IN2 is supplied to the gate.

The low breakdown voltage NMOS transistors N1 and N2 are placed between the high breakdown voltage depression NMOS transistors NA1 and NA2 and the reference voltage terminal VSS, respectively.

To be more specific, in the low breakdown voltage NMOS transistor N1, the source is connected to the reference voltage terminal VSS, the drain is connected to the node INT1, and a control signal (third control signal) IN3 is supplied to the gate. In the low breakdown voltage NMOS transistor N2, the source is connected to the reference voltage terminal VSS, the drain is connected to the node INT2, and a control signal (fourth control signal) IN4 is supplied to the gate.

The timing control circuit 12 is placed between a power supply voltage terminal to which a power supply voltage VDD with a lower voltage than the power supply voltage VDDQ is supplied (second power supply voltage terminal; which is referred to hereinafter as a power supply voltage terminal VDD) and the reference voltage terminal VSS, and generates the control signals IN1 and IN3 by inverting an input signal supplied from outside to an input terminal IN (which is referred to hereinafter as an input signal IN). In other words, the timing control circuit 12 generates the control signals IN1 and IN3 that correspond to the inverted signal of the input signal IN. The control signals IN1 and IN3 are different signals. The input signal IN has a potential level in the range between the power supply voltage VDD and the reference voltage terminal VSS.

The timing control circuit 13 is placed between the power supply voltage terminal VDD and the reference voltage terminal VSS, and generates the control signals IN2 and IN4 by inverting the inverted signal of the input signal IN. In other words, the timing control circuit 13 generates the control signals IN2 and IN4 that correspond to the non-inverted signal of the input signal IN. The control signals IN2 and IN4 are different signals.

Thus, the timing control unit composed of the timing control circuits 12 and 13 and the inverter INV1 is placed between the power supply voltage terminal VDD and the reference voltage terminal VSS, and generates the control signal IN1 and the control signal IN3 different from the control signal IN1 that correspond to the inverted signal of the input signal IN and generates the control signal IN2 and the control signal IN4 different from the control signal IN2 that correspond to the non-inverted signal of the input signal IN.

For example, the timing control unit generates the control signals IN1 and IN2 with a lower slew rate at a rising edge than that of the control signals IN3 and IN4 and generates the control signals IN3 and IN4 with a lower slew rate at a falling edge than that of the control signals IN1 and IN2. Therefore, the low breakdown voltage NMOS transistors N1 and N2 can turn off after the on-resistance of the high breakdown voltage depression NMOS transistors NA1 and NA2 becomes equal to or higher than a specified value. Further, the low breakdown voltage NMOS transistors N1 and N2 can turn on before the on-resistance of the high breakdown voltage depression NMOS transistors NA1 and NA2 becomes lower than the specified value. As a result, it is possible to prevent a voltage exceeding a withstand voltage being applied to the low breakdown voltage NMOS transistors N1 and N2.

(Operation of Level Shifter 1)

Figure 2:
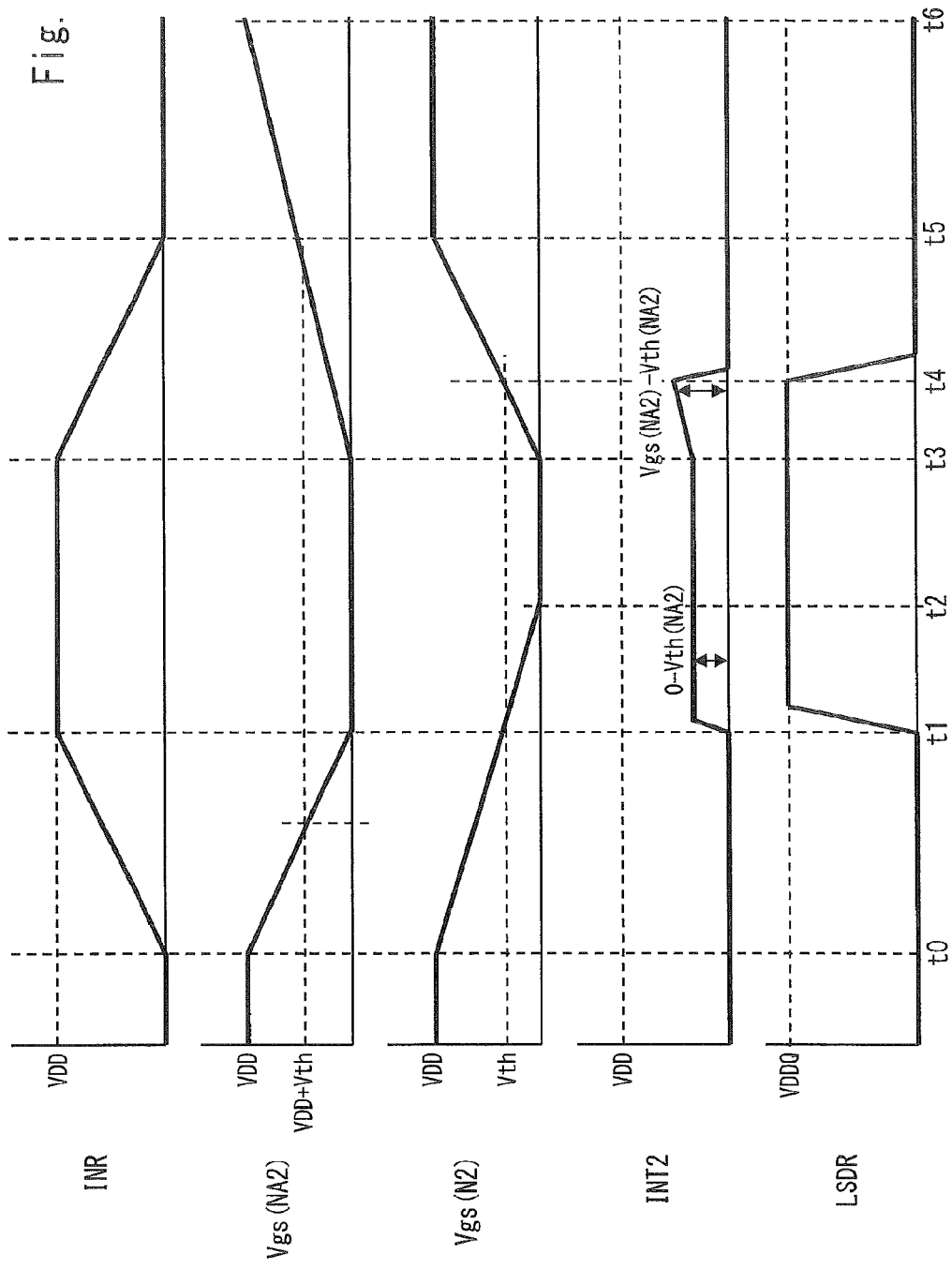
FIG. 2 is a timing chart showing an operation of the level shifter according to the first embodiment.

The operation of the level shifter 1 according to this embodiment is described hereinafter with reference to FIG. 2. FIG. 2 is a timing chart showing the operation of the level shifter 1. Note that, in FIG. 2, Vgs (NA2) represents a gate-source voltage of the high breakdown voltage depression NMOS transistor NA2, and Vgs (N2) represents a gate-source voltage of the low breakdown voltage NMOS transistor N2.

First, the input signal IN falls from H level (power supply voltage VDD) to L level (reference voltage VSS). In response thereto, the inverted signal INR of the input signal IN rises from L level to H level (time t0 to t1). At this time, the timing control circuit 13 causes the control signal IN2 to fall from H level to L level (time t0 to t1) and the control signal IN4 to fall from H level to L level with a lower slew rate (in a slower time) than that of the control signal IN2 (time t0 to t2). Consequently, the low breakdown voltage NMOS transistor N2 turns off after the on-resistance of the high breakdown voltage depression NMOS transistor NA2 becomes high enough. A voltage at the node INT2 is thereby kept low, and a voltage exceeding a withstand voltage is not applied to the low breakdown voltage NMOS transistor N2. The degradation of the low breakdown voltage NMOS transistor N2 is thereby reduced.

Note that a potential at the node INT2 is obtained by subtracting the threshold voltage Vth (NA2) from the gate-source voltage Vgs (NA2) of the high breakdown voltage depression NMOS transistor NA2. Accordingly, the potential at the node INT2 when the low breakdown voltage NMOS transistor N2 turns off is about 0−Vth=|Vth|. Because the threshold voltage Vth (NA2) is about 0V to −0.several V, a voltage exceeding a withstand voltage is not applied to the low breakdown voltage NMOS transistor N2.

On the other hand, though not shown, the timing control circuit 12 causes the control signal IN3 to rise from L level to H level (time t0 to t1) and the control signal IN1 to rise from L level to H level with a lower slew rate (in a slower time) than that of the control signal IN3 (time t0 to t2). Consequently, the low breakdown voltage NMOS transistor N1 turns on while the on-resistance of the high breakdown voltage depression NMOS transistor NA1 is still high. A voltage at the node INT1 is thereby kept low, and a voltage exceeding a withstand voltage is not applied to the low breakdown voltage NMOS transistor N1. The degradation of the low breakdown voltage NMOS transistor N1 is thereby reduced.

Because the low breakdown voltage NMOS transistor N2 turns off and the low breakdown voltage NMOS transistor N1 turns on, a potential at the node LSDR rises to about the power supply voltage VDDQ, and a potential at the node LSDL falls to about the reference voltage VSS. The voltage at the node LSDR is output to the outside through an output terminal OUT.

Next, the input signal IN rises from L level to H level. In response thereto, the inverted signal INR of the input signal IN falls from H level to L level (time t3 to t5). At this time, the timing control circuit 13 causes the control signal IN4 to rise from L level to H level (time t3 to t5) and the control signal IN2 to rise from L level to H level with a lower slew rate (in a slower time) than that of the control signal IN4 (time t3 to t6). Consequently, the low breakdown voltage NMOS transistor N2 turns on while the on-resistance of the high breakdown voltage depression NMOS transistor NA2 is still high. A voltage at the node INT2 is thereby kept low, and a voltage exceeding a withstand voltage is not applied to the low breakdown voltage NMOS transistor N2. The degradation of the low breakdown voltage NMOS transistor N2 is thereby reduced.

Note that the potential at the node INT2 is obtained by subtracting the threshold voltage Vth (NA2) from the gate-source voltage Vgs (NA2) of the high breakdown voltage depression NMOS transistor NA2 as described above. Because the voltage level of the control signal IN2 at the time when the low breakdown voltage NMOS transistor N2 turns from off to on does not yet reach H level (power supply voltage VDD), Vgs (NA2) is lower than the power supply voltage VDD. Accordingly, the potential at the node INT2 is lower than VDD. Therefore, a voltage exceeding a withstand voltage is not applied to the low breakdown voltage NMOS transistor N2.

On the other hand, though not shown, the timing control circuit 12 causes the control signal IN1 to fall from H level to L level (time t3 to t5) and the control signal IN3 to fall from H level to L level with a lower slew rate (in a slower time) than that of the control signal IN1 (time t3 to t6). Consequently, the low breakdown voltage NMOS transistor N1 turns off after the on-resistance of the high breakdown voltage depression NMOS transistor NA1 becomes high enough. A voltage at the node INT1 is thereby kept low, and a voltage exceeding a withstand voltage is not applied to the low breakdown voltage NMOS transistor N1. The degradation of the low breakdown voltage NMOS transistor N1 is thereby reduced.

Because the low breakdown voltage NMOS transistor N1 turns off and the low breakdown voltage NMOS transistor N2 turns on, a potential at the node LSDL rises to about the power supply voltage VDDQ, and a potential at the node LSDR falls to about the reference voltage VSS. The voltage at the node LSDR is output to the outside through the output terminal OUT.

More specifically, the timing control circuit 13 generates the control signals IN2 and IN4 so that the gate-source voltage of the high breakdown voltage depression NMOS transistor NA2 at the time when the gate-source voltage of the low breakdown voltage NMOS transistor N2 falls so as to be lower than the threshold voltage of the low breakdown voltage NMOS transistor N2 (time t1 in FIG. 2) is lower than the sum of the threshold voltage of the high breakdown voltage depression NMOS transistor NA2 and the power supply voltage VDD. Further, the timing control circuit 13 generates the control signals IN2 and IN4 so that the gate-source voltage of the high breakdown voltage depression NMOS transistor NA2 at the time when the gate-source voltage of the low breakdown voltage NMOS transistor N2 rises so as to be equal to or higher than the threshold voltage of the low breakdown voltage NMOS transistor N2 (time t4 in FIG. 2) is lower than the sum of the threshold voltage of the high breakdown voltage depression NMOS transistor NA2 and the power supply voltage VDD.

Likewise, the timing control circuit 12 generates the control signals IN1 and IN3 so that the gate-source voltage of the high breakdown voltage depression NMOS transistor NA1 at the time when the gate-source voltage of the low breakdown voltage NMOS transistor N1 falls so as to be lower than the threshold voltage of the low breakdown voltage NMOS transistor N1 is lower than the sum of the threshold voltage of the high breakdown voltage depression NMOS transistor NA1 and the power supply voltage VDD. Further, the timing control circuit 12 generates the control signals IN1 and IN3 so that the gate-source voltage of the high breakdown voltage depression NMOS transistor NA1 at the time when the gate-source voltage of the low breakdown voltage NMOS transistor N1 rises so as to be equal to or higher than the threshold voltage of the low breakdown voltage NMOS transistor N1 is lower than the sum of the threshold voltage of the high breakdown voltage depression NMOS transistor NA1 and the power supply voltage VDD.

As described above, the level shifter 1 according to this embodiment controls the conduction states of the low breakdown voltage NMOS transistors N1 and N2 and the high breakdown voltage depression NMOS transistors NA1 and NA2 with different control signals and thereby prevents a voltage exceeding a withstand voltage being applied to the low breakdown voltage NMOS transistors N1 and N2. This reduces degradation of the low breakdown voltage NMOS transistors N1 and N2. It is thereby possible to achieve a high-speed operation without degrading reliability.

(First Specific Configuration Example of Level Shifter 1)

Figure 3:
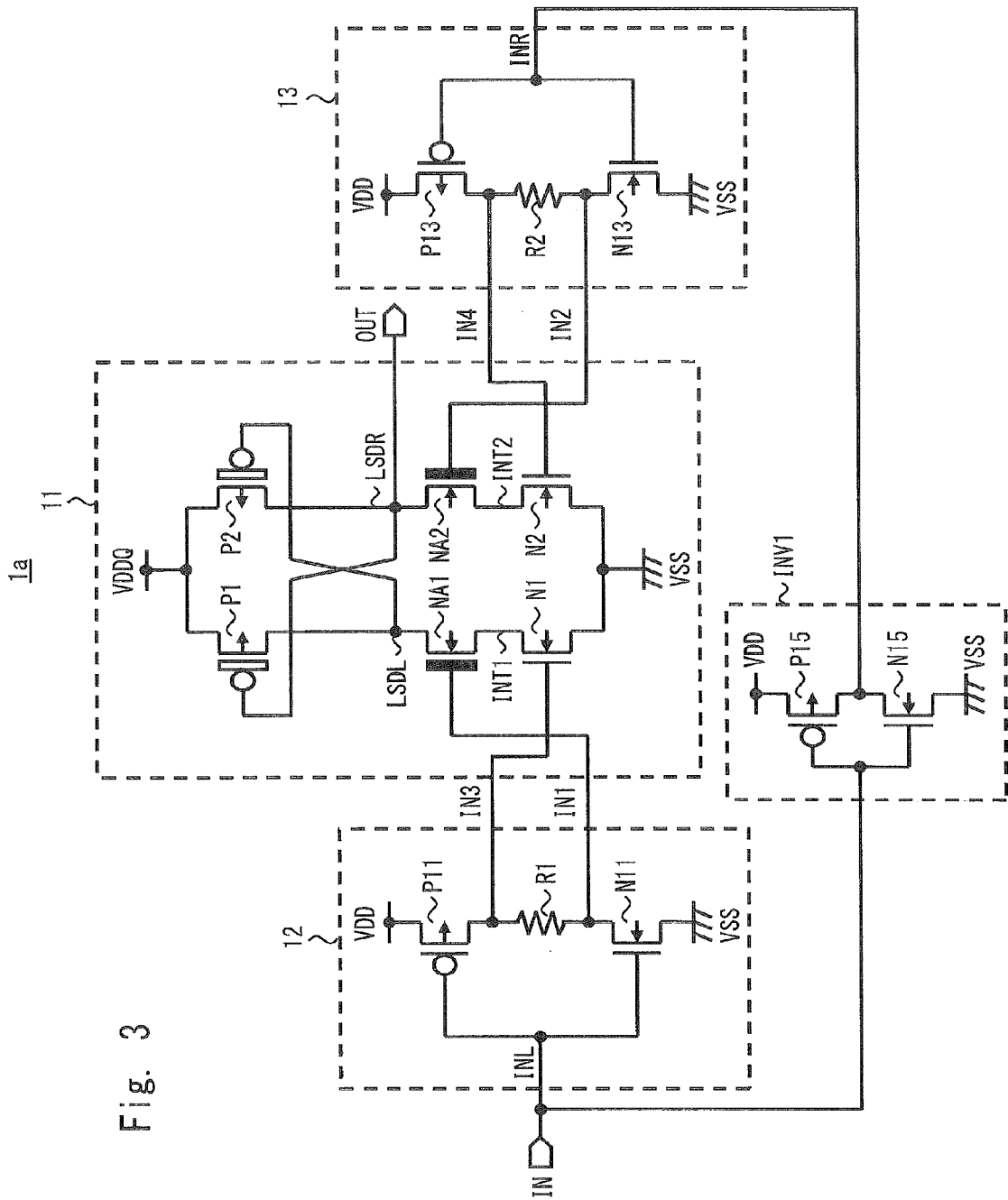
FIG. 3 is a diagram showing a first specific configuration example of the level shifter according to the first embodiment.

FIG. 3 is a diagram showing a first specific configuration example of the level shifter 1 as a level shifter 1a. In FIG. 3, the timing control circuit 12 includes a low breakdown voltage PMOS transistor (third PMOS transistor) P11, a low breakdown voltage NMOS transistor (third NMOS transistor) N11, and a resistor (first resistor) R1. The timing control circuit 13 includes a low breakdown voltage PMOS transistor (fourth PMOS transistor) P13, a low breakdown voltage NMOS transistor (fourth NMOS transistor) N13, and a resistor (second resistor) R2.

In the timing control circuit 12, the low breakdown voltage PMOS transistor P11 and the low breakdown voltage NMOS transistor N11 are placed in series between the power supply voltage terminal VDD and the reference voltage terminal VSS, and the input signal IN is supplied to each gate. The resistor R1 is placed between the low breakdown voltage PMOS transistor P11 and the low breakdown voltage NMOS transistor N11. The timing control circuit 12 generates a voltage at a node between the low breakdown voltage PMOS transistor P11 and the resistor R1 as the control signal IN3, and generates a voltage at a node between the low breakdown voltage NMOS transistor N11 and the resistor R1 as the control signal IN1. The timing control circuit 12 can thereby generate the control signal IN1 with a lower slew rate at a rising edge than that of the control signal IN3 and generate the control signal IN3 with a lower slew rate at a falling edge than that of the control signal IN1. Note that the slew rate of the control signals IN1 and IN3 can be adjusted by adjusting the size of the low breakdown voltage PMOS transistor P11, the size of the low breakdown voltage NMOS transistor N11, and the resistance value of the resistor R1.

In the timing control circuit 13, the low breakdown voltage PMOS transistor P13 and the low breakdown voltage NMOS transistor N13 are placed in series between the power supply voltage terminal VDD and the reference voltage terminal VSS, and the inverted signal of the input signal IN is supplied to each gate. The resistor R2 is placed between the low breakdown voltage PMOS transistor P13 and the low breakdown voltage NMOS transistor N13. The timing control circuit 13 generates a voltage at a node between the low breakdown voltage PMOS transistor P13 and the resistor R2 as the control signal IN4, and generates a voltage at a node between the low breakdown voltage NMOS transistor N13 and the resistor R2 as the control signal IN2. The timing control circuit 13 can thereby generate the control signal IN2 with a lower slew rate at a rising edge than that of the control signal IN4 and generate the control signal IN4 with a lower slew rate at a falling edge than that of the control signal IN2. Note that the slew rate of the control signals IN2 and IN4 can be adjusted by adjusting the size of the low breakdown voltage PMOS transistor P13, the size of the low breakdown voltage NMOS transistor N13, and the resistance value of the resistor R2.

An inverter INV1 is composed of a low breakdown voltage PMOS transistor P15 and a low breakdown voltage NMOS transistor N15. The low breakdown voltage PMOS transistor P15 and the low breakdown voltage NMOS transistor N15 are placed in series between the power supply voltage terminal VDD and the reference voltage terminal VSS. The inverter INV1 receives the input signal IN through the gates of the low breakdown voltage PMOS transistor P15 and the low breakdown voltage NMOS transistor N15 and outputs a voltage at a node between the low breakdown voltage PMOS transistor P15 and the low breakdown voltage NMOS transistor N15 as the inverted signal of the input signal IN.

The other configuration of the level shifter 1a shown in FIG. 3 is the same as that of the level shifter 1 shown in FIG. 1 and not redundantly described herein.

(First Modified Example of Level Shifter 1a)

Figure 4:
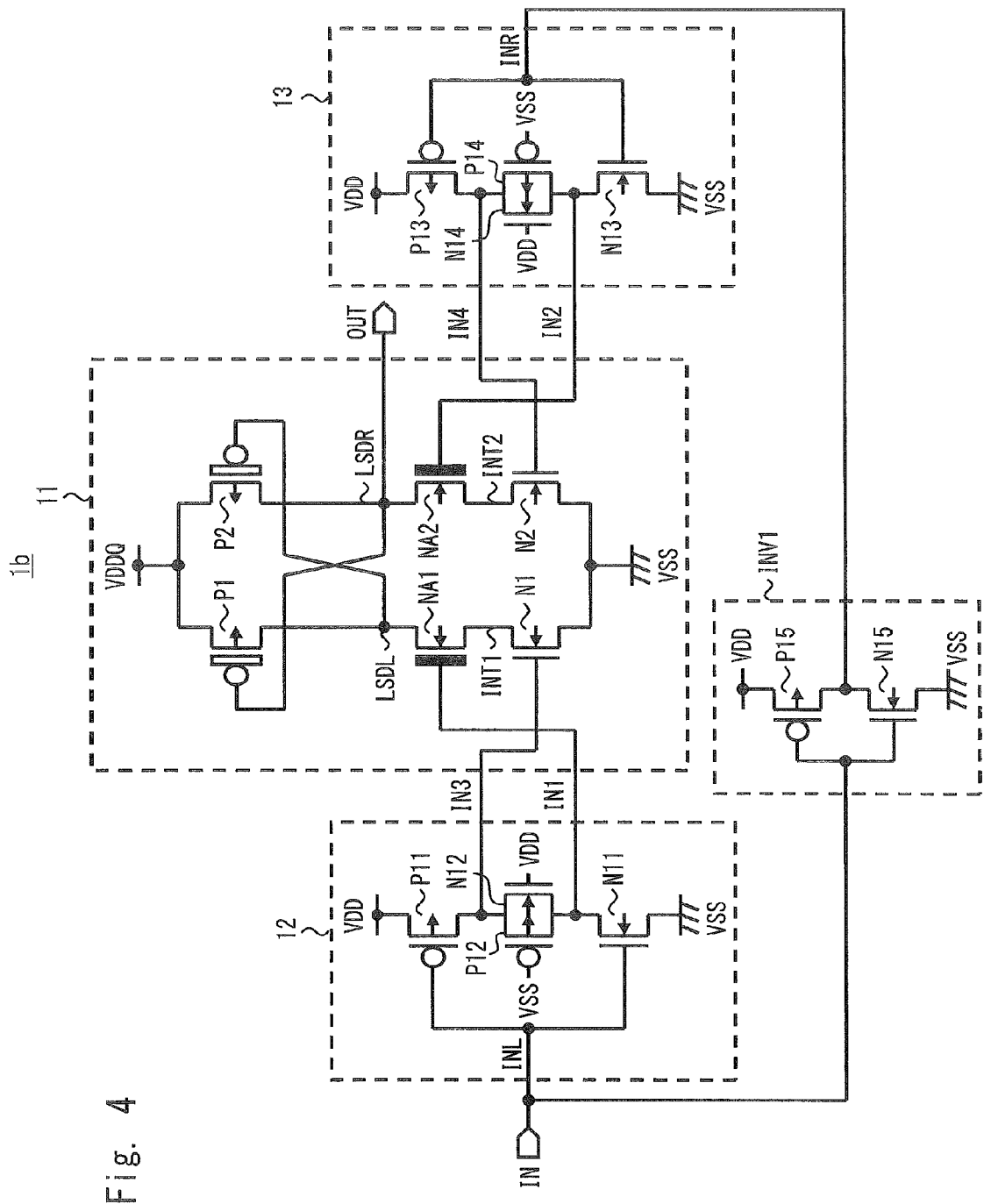
FIG. 4 is a diagram showing a first modified example of the level shifter shown in FIG. 3.

FIG. 4 is a diagram showing a first modified example of the level shifter 1a shown in FIG. 3 as a level shifter 1b. The timing control circuits 12 and 13 shown in FIG. 4 are different from the timing control circuits 12 and 13 shown in FIG. 3 in that they include transfer gates T1 and T2 as the resistors R1 and R2.

The transfer gate T1 is composed of a low breakdown voltage PMOS transistor P12 and a low breakdown voltage NMOS transistor N12. The transfer gate T2 is composed of a low breakdown voltage PMOS transistor P14 and a low breakdown voltage NMOS transistor N14. The other configuration of the level shifter 1b shown in FIG. 4 is the same as that of the level shifter 1a shown in FIG. 3 and not redundantly described herein.

(Second Modified Example of Level Shifter 1a)

Figure 5:
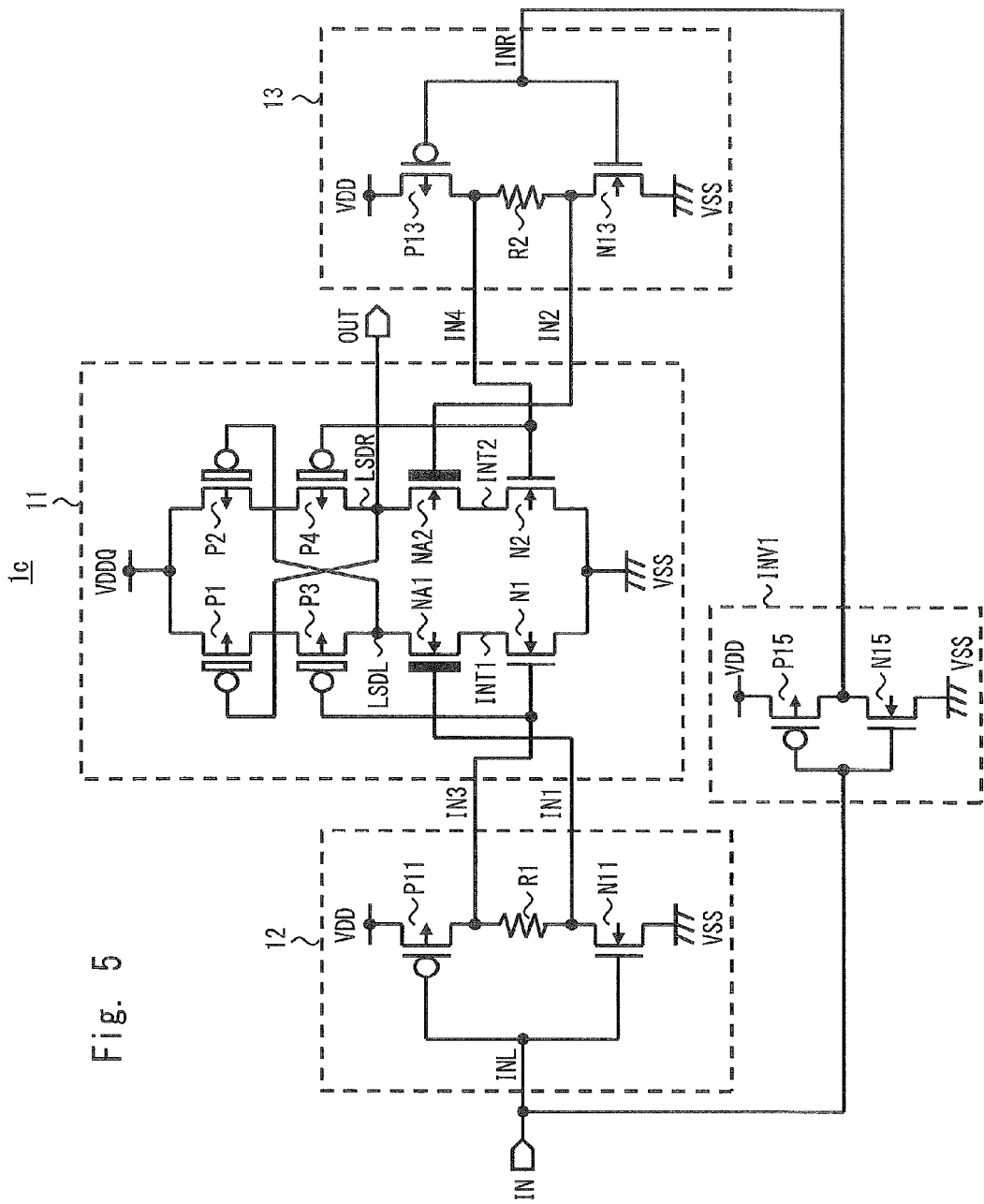
FIG. 5 is a diagram showing a second modified example of the level shifter shown in FIG. 3.

FIG. 5 is a diagram showing a second modified example of the level shifter 1a shown in FIG. 3 as a level shifter 1c. The level shift unit 11 shown in FIG. 5 is different from the level shift unit 11 shown in FIG. 3 in that it further includes high breakdown voltage PMOS transistors P3 and P4.

The high breakdown voltage PMOS transistor P3 is placed between the drain of the high breakdown voltage PMOS transistor P1 and the node LSDL, and the control signal IN3 is supplied to its gate. The high breakdown voltage PMOS transistor P4 is placed between the drain of the high breakdown voltage PMOS transistor P2 and the node LSDR, and the control signal IN4 is supplied to its gate. The other configuration of the level shifter 1c shown in FIG. 5 is the same as that of the level shifter 1a shown in FIG. 3 and not redundantly described herein.

The level shifter 1c shown in FIG. 5 has the same advantageous effects as those of the level shifter 1a shown in FIG. 3.

(Second Specific Configuration Example of Level Shifter 1)

Figure 6:
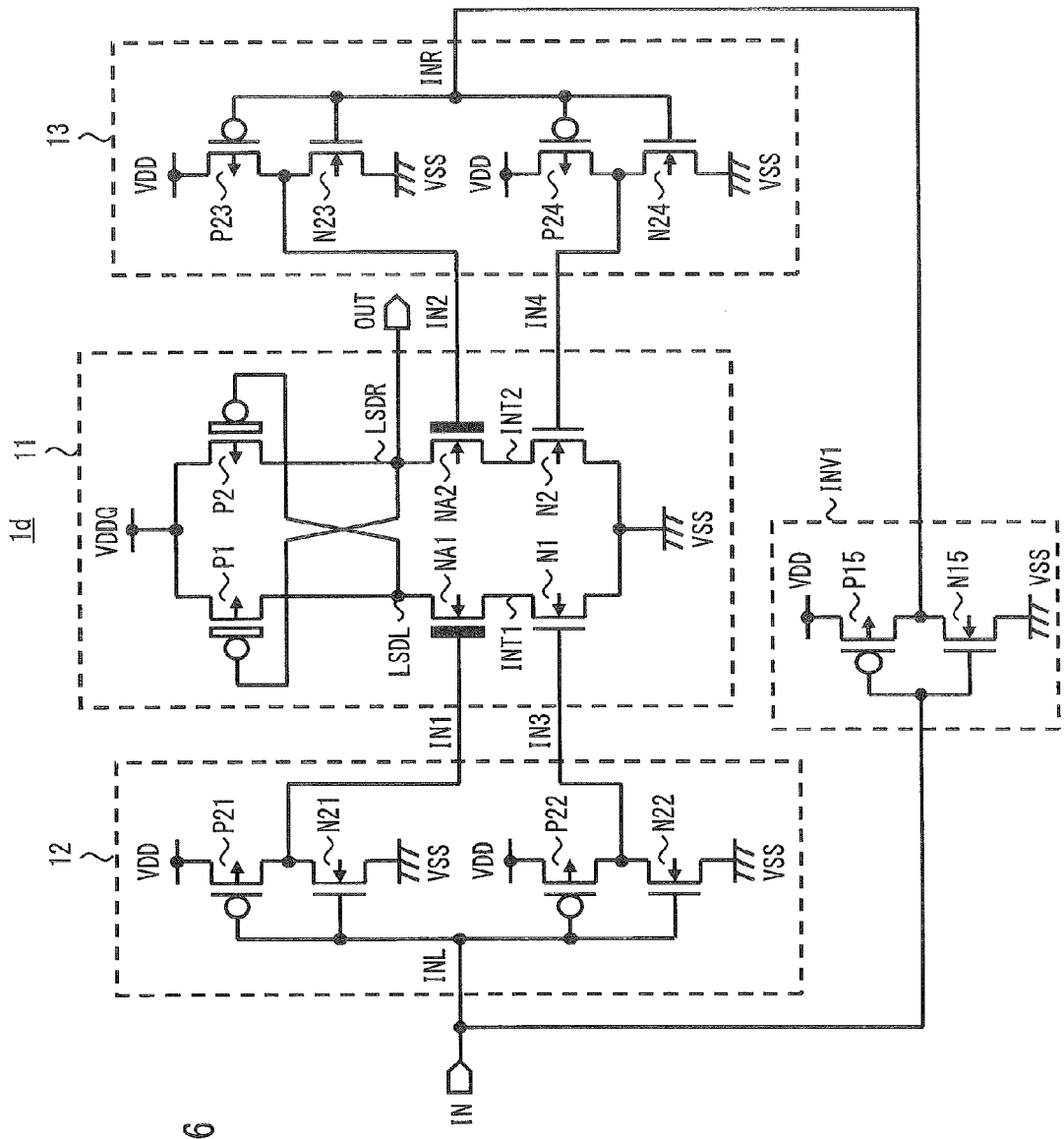
FIG. 6 is a diagram showing a second specific configuration example of the level shifter according to the first embodiment.

FIG. 6 is a diagram showing a second specific configuration example of the level shifter 1 as a level shifter 1d. In FIG. 6, the timing control circuit 12 includes a low breakdown voltage PMOS transistor (third PMOS transistor) P21, a low breakdown voltage PMOS transistor (fourth PMOS transistor) P22, a low breakdown voltage NMOS transistor (third NMOS transistor) N21, and a low breakdown voltage NMOS transistor (fourth NMOS transistor) N22. The timing control circuit 13 includes a low breakdown voltage PMOS transistor (fifth PMOS transistor) P23, a low breakdown voltage PMOS transistor (sixth PMOS transistor) P24, a low breakdown voltage NMOS transistor (fifth NMOS transistor) N23, and a low breakdown voltage NMOS transistor (sixth NMOS transistor) N24.

In the timing control circuit 12, the low breakdown voltage PMOS transistor P21 and the low breakdown voltage NMOS transistor N21 are placed in series between the power supply voltage terminal VDD and the reference voltage terminal VSS, and the input signal IN is supplied to each gate. The low breakdown voltage PMOS transistor P22 and the low breakdown voltage NMOS transistor N22 are placed in series between the power supply voltage terminal VDD and the reference voltage terminal VSS, and the inverted signal of the input signal IN is supplied to each gate. The timing control circuit 12 generates a voltage at a node between the low breakdown voltage PMOS transistor P21 and the low breakdown voltage NMOS transistor N21 as the control signal IN1, and generates a voltage at a node between the low breakdown voltage PMOS transistor P22 and the low breakdown voltage NMOS transistor N22 as the control signal IN3. The driving capability of the low breakdown voltage PMOS transistor P21 is lower than the driving capability of the low breakdown voltage PMOS transistor P22. On the other hand, the driving capability of the low breakdown voltage NMOS transistor N21 is higher than the driving capability of the low breakdown voltage NMOS transistor N22. The timing control circuit 12 can thereby generate the control signal IN1 with a lower slew rate at a rising edge than that of the control signal IN3 and generate the control signal IN3 with a lower slew rate at a falling edge than that of the control signal IN1. Note that the respective slew rates of the control signals IN1 and IN3 can be adjusted by adjusting the respective driving capabilities of the transistors P21, P22, N21 and N22.

In the timing control circuit 13, the low breakdown voltage PMOS transistor P23 and the low breakdown voltage NMOS transistor N23 are placed in series between the power supply voltage terminal VDD and the reference voltage terminal VSS, and the input signal IN is supplied to each gate. The low breakdown voltage PMOS transistor P24 and the low breakdown voltage NMOS transistor N24 are placed in series between the power supply voltage terminal VDD and the reference voltage terminal VSS, and the inverted signal of the input signal IN is supplied to each gate. The timing control circuit 13 generates a voltage at a node between the low breakdown voltage PMOS transistor P23 and the low breakdown voltage NMOS transistor N23 as the control signal IN2, and generates a voltage at a node between the low breakdown voltage PMOS transistor P24 and the low breakdown voltage NMOS transistor N24 as the control signal IN4. The driving capability of the low breakdown voltage PMOS transistor P23 is lower than the driving capability of the low breakdown voltage PMOS transistor P24. On the other hand, the driving capability of the low breakdown voltage NMOS transistor N23 is higher than the driving capability of the low breakdown voltage NMOS transistor N24. The timing control circuit 13 can thereby generate the control signal IN2 with a lower slew rate at a rising edge than that of the control signal IN4 and generate the control signal IN4 with a lower slew rate at a falling edge than that of the control signal IN2. Note that the respective slew rates of the control signals IN2 and IN4 can be adjusted by adjusting the respective driving capabilities of the transistors P23, P24, N23 and N24.

The other configuration of the level shifter 1d shown in FIG. 6 is the same as that of the level shifter 1a shown in FIG. 3 and not redundantly described herein.

In the level shifter 1d shown in FIG. 6, each of the timing control circuits generates two different control signals using two inverters. The level shifter 1d shown in FIG. 6 can thereby easily adjust the timing between the control signals IN1 and IN3 and the timing between the control signals IN2 and IN4.

(Modified Example of Level Shifter 1d)

Figure 7:
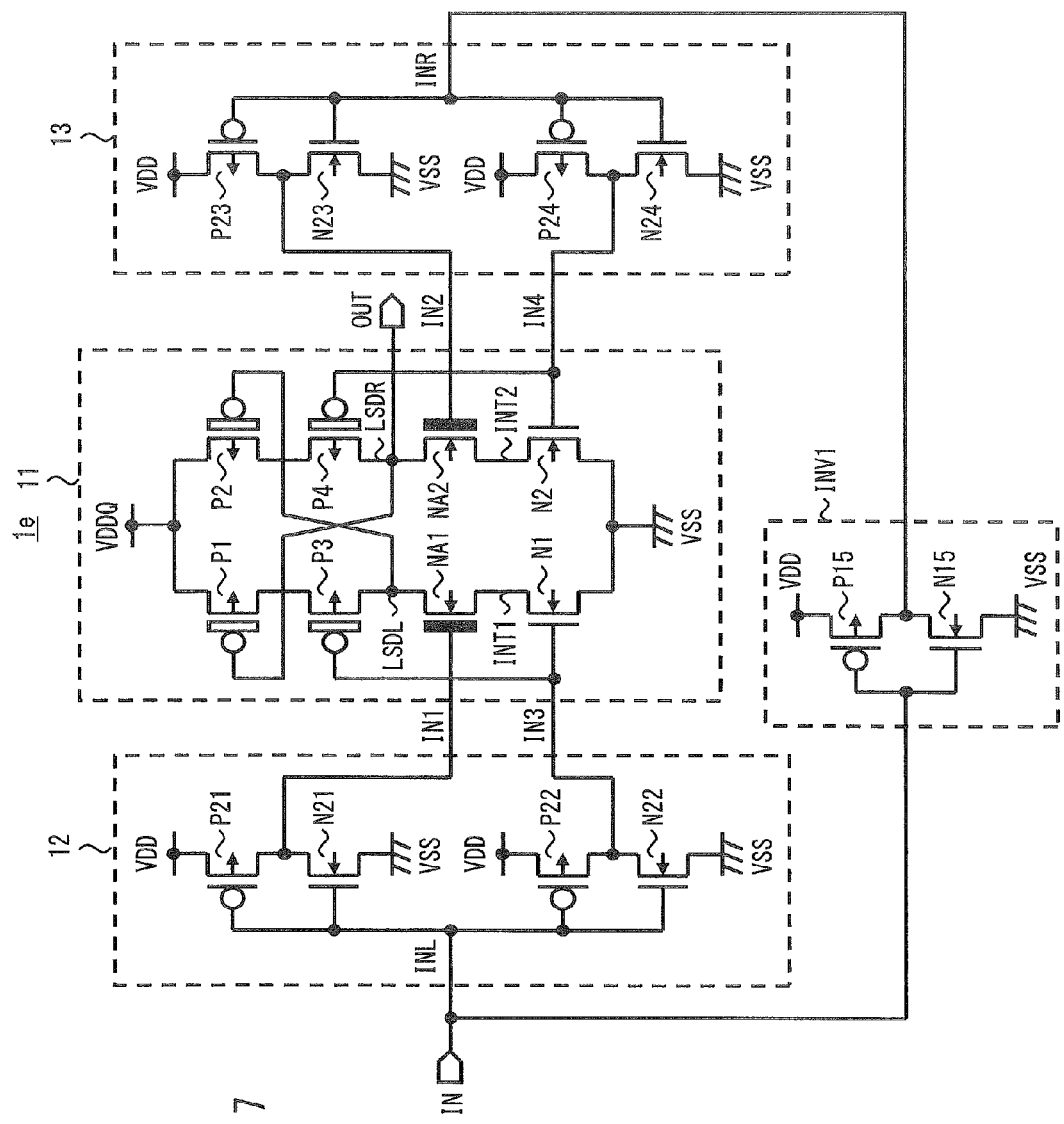
FIG. 7 is a diagram showing a first modified example of the level shifter shown in FIG. 6.

FIG. 7 is a diagram showing a modified example of the level shifter 1d shown in FIG. 6 as a level shifter 1e. The level shift unit 11 shown in FIG. 7 is different from the level shift unit 11 shown in FIG. 6 in that it further includes high breakdown voltage PMOS transistors P3 and P4.

The high breakdown voltage PMOS transistor P3 is placed between the drain of the high breakdown voltage PMOS transistor P1 and the node LSDL, and the control signal IN3 is supplied to its gate. The high breakdown voltage PMOS transistor P4 is placed between the drain of the high breakdown voltage PMOS transistor P2 and the node LSDR, and the control signal IN4 is supplied to its gate. The other configuration of the level shifter 1e shown in FIG. 7 is the same as that of the level shifter 1d shown in FIG. 6 and not redundantly described herein.

The level shifter 1e shown in FIG. 7 has the same advantageous effects as those of the level shifter 1d shown in FIG. 6.

Second Embodiment

Figure 8:
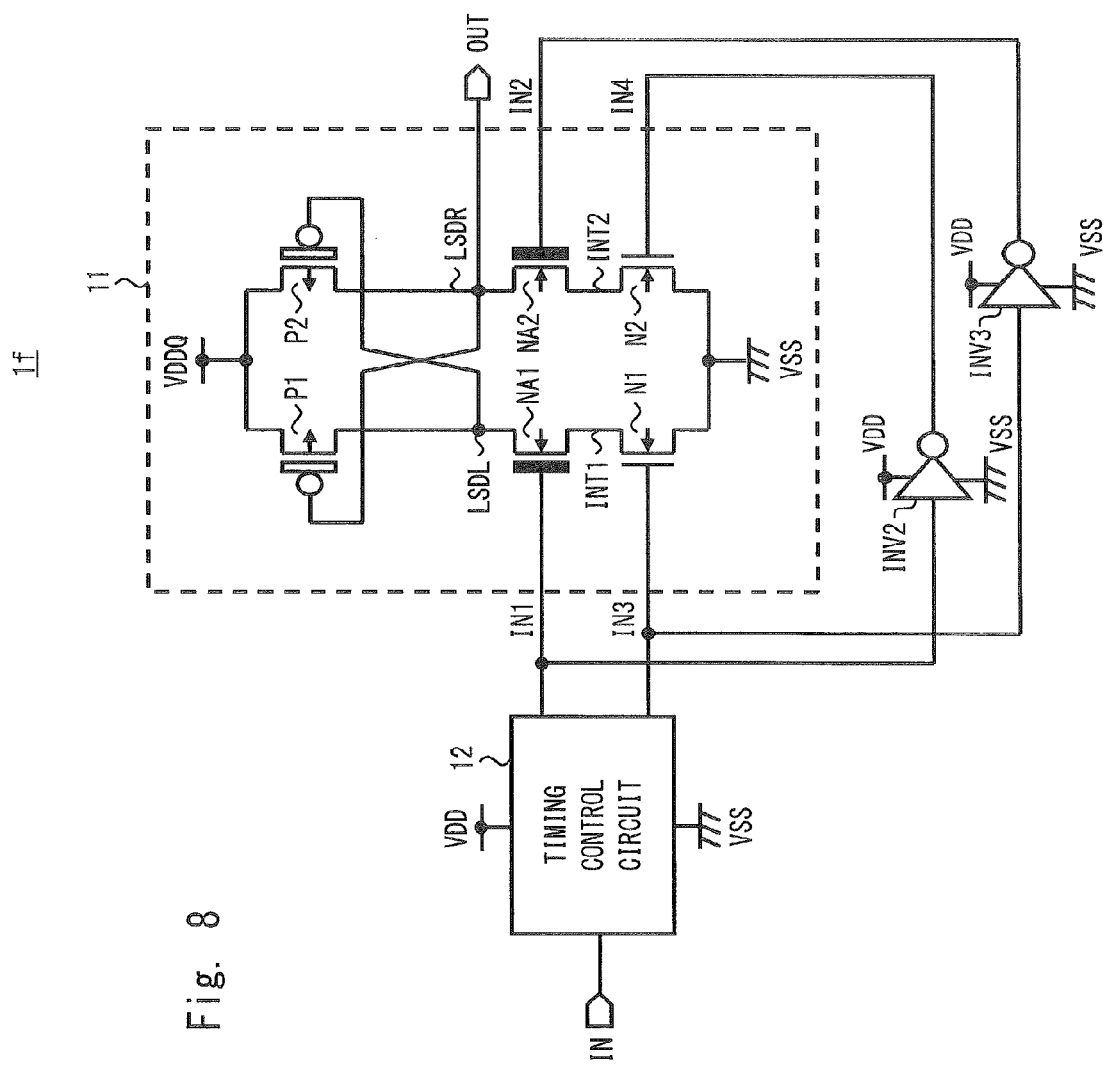
FIG. 8 is a diagram showing a configuration example of a level shifter according to a second embodiment.

FIG. 8 is a diagram showing a configuration example of a level shifter 1f according to a second embodiment. The level shifter 1f shown in FIG. 8 is different from the level shifter 1 shown in FIG. 1 in that it Includes only the timing control circuit 12 instead of both of the timing control circuits 12 and 13, and Includes inverters INV2 and INV3 in place of the inverter INV1. Note that the timing control circuit 12 and the Inverters INV2 and INV3 constitute a timing control unit.

The timing control circuit 12 is placed between the power supply voltage terminal VDD and the reference voltage terminal VSS, and generates the control signals IN1 and IN3 corresponding to the inverted signal of the Input signal IN. The control signals IN1 and IN3 are different signals.

The inverters INV2 and INV3 have the same circuit configuration as that of the inverter INV1, and output the inverted signals of the control signals IN1 and IN3 as control signals IN4 and IN2, respectively. Because the control signals IN1 and IN3 are different signals, the control signals IN2 and IN4 are also different signals.

In other words, the timing control unit composed of the timing control circuit 12 and the inverters INV2 and INV3 is placed between the power supply voltage terminal VDD and the reference voltage terminal VSS, and generates the control signal IN1 and the control signal IN3 different from the control signal IN1 that correspond to the inverted signal of the input signal IN and generates the control signal IN2 and the control signal IN4 different from the control signal IN2 that correspond to the non-inverted signal of the input signal IN.

For example, the timing control unit generates the control signals IN1 and IN2 with a lower slew rate at a rising edge than that of the control signals IN3 and IN4 and generates the control signals IN3 and IN4 with a lower slew rate at a falling edge than that of the control signals IN1 and IN2. Therefore, the on-resistance of the high breakdown voltage depression NMOS transistors NA1 and NA2 can be equal to or higher than a specified value before the low breakdown voltage NMOS transistors N1 and N2 turn off. Further, the on-resistance of the high breakdown voltage depression NMOS transistors NA1 and NA2 can be equal to or higher than a specified value after the low breakdown voltage NMOS transistors N1 and N2 turn on. As a result, it is possible to prevent a voltage exceeding a withstand voltage being applied to the low breakdown voltage NMOS transistors N1 and N2.

The operation of the level shifter 1f shown in FIG. 8 is the same as that of the level shifter 1 shown in FIG. 1 and not redundantly described.

The level shifter according to this embodiment has the same advantageous effects as those of the level shifter according to the first embodiment.

(First Specific Configuration Example of Level Shifter 1f)

Figure 9:
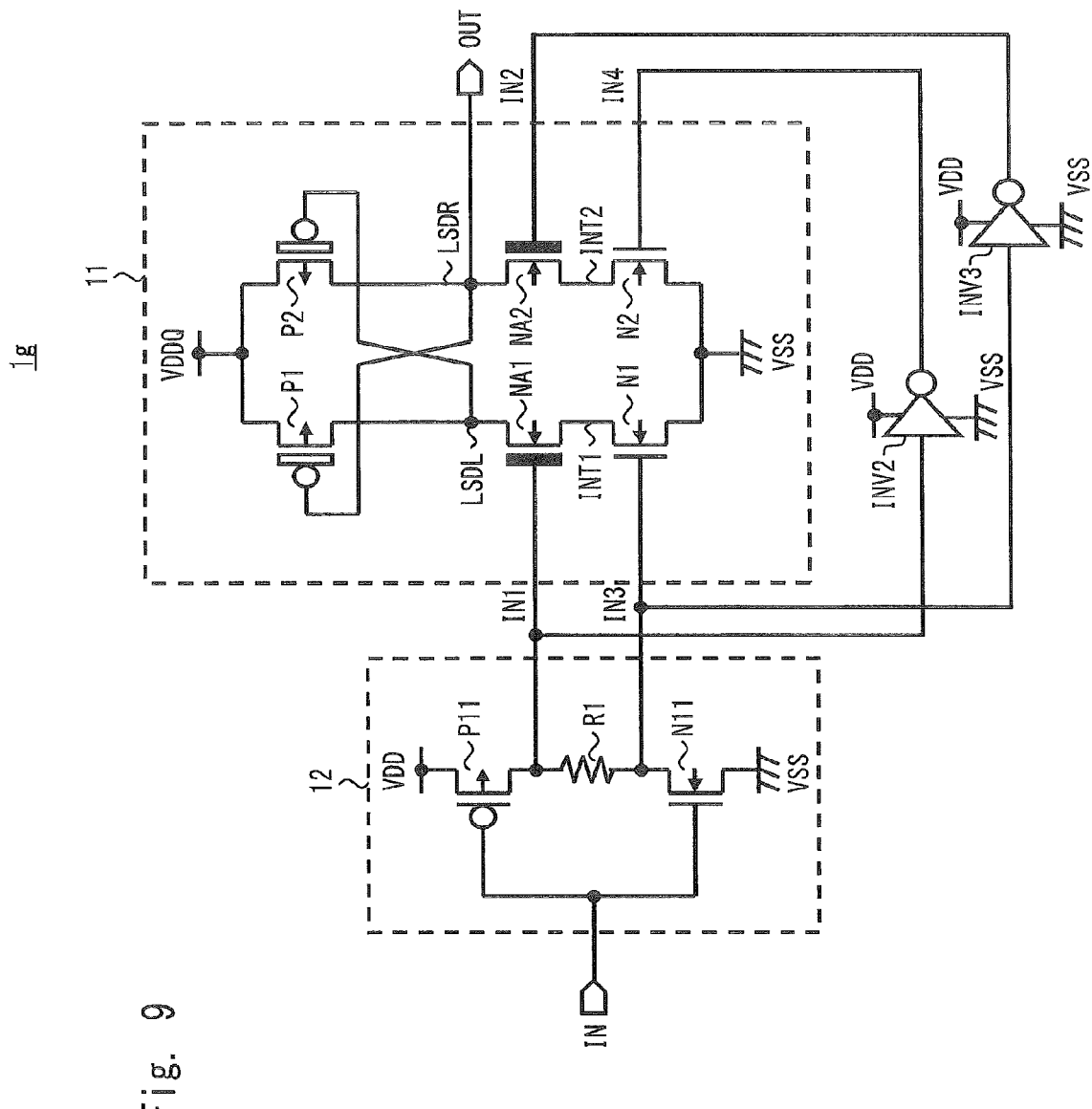
FIG. 9 is a diagram showing a first specific configuration example of the level shifter according to the second embodiment.

FIG. 9 is a diagram showing a first specific configuration example of the level shifter 1f as a level shifter 1g. In FIG. 9, the timing control circuit 12 includes a low breakdown voltage PMOS transistor P11, a low breakdown voltage NMOS transistor N11 and a resistor R1. Specific connections are the same as those of the timing control circuit 12 shown in FIG. 3. Note that the resistor R1 may be a transfer gate or the like.

(Second Specific Configuration Example of Level Shifter 1f)

Figure 10:
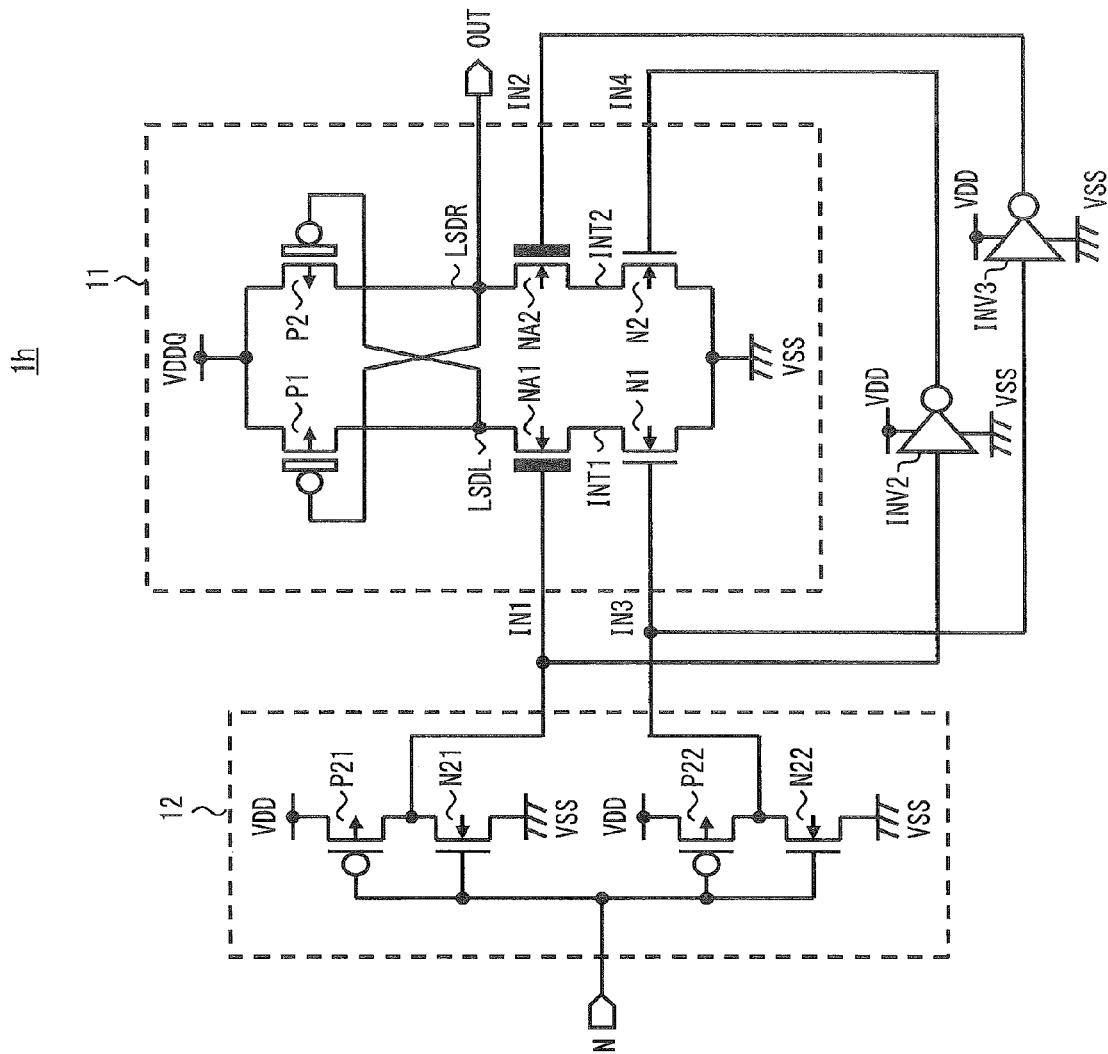
FIG. 10 is a diagram showing a second specific configuration example of the level shifter according to the second embodiment.

FIG. 10 is a diagram showing a second specific configuration example of the level shifter 1f as a level shifter 1h. In FIG. 10, the timing control circuit 12 includes a low breakdown voltage PMOS transistor P21, a low breakdown voltage PMOS transistor P22, a low breakdown voltage NMOS transistor N21 and a low breakdown voltage NMOS transistor N22. Specific connections are the same as those of the timing control circuit 12 shown in FIG. 6.

As described above, the level shifter according to the above-described embodiments controls the conduction states of the low breakdown voltage NMOS transistors N1 and N2 and the high breakdown voltage depression NMOS transistors NA1 and NA2 with different control signals and thereby prevents a voltage exceeding a withstand voltage being applied to the low breakdown voltage NMOS transistors N1 and N2. This reduces degradation of the low breakdown voltage NMOS transistors N1 and N2. The level shifter according to the above-described embodiments can thereby achieve a high-speed operation without degrading reliability.

Although embodiments of the present invention are described in the foregoing, the present invention is not restricted to the above-described embodiments, and various changes and modifications may be made without departing from the scope of the invention.

For example, in the level shifter according to the above embodiment, the conductivity type (P type or N type) of a semiconductor substrate, a semiconductor layer, a diffusion layer (diffusion region) and the like may be inverted. Accordingly, when one conductivity type of N type and P type is a first conductivity type and the other conductivity type thereof is a second conductivity type, the first conductivity type may be P type and the second conductivity type may be N type, or on the contrary the first conductivity type may be N type and the second conductivity type may be P type.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A level shifter comprising:
a first and a second transistor coupled to a first power supply voltage terminal supplied with a second power supply voltage in parallel, the first transistor having a first gate connected to a drain of the second transistor and a first gate insulating film, and the second transistor having a second gate connected to a drain of the first transistor and a second gate insulating film;
a third and a fourth transistor coupled to a reference voltage terminal in parallel, the third transistor having a third gate supplied with a first control signal and a third gate insulating film, and the fourth transistor having a fourth gate supplied with a second control signal and a fourth gate insulating film;
a first and a second depression transistor, the first depression transistor being coupled between the first and the third transistor and having a fifth gate supplied with a third control signal and a fifth gate insulating film, the second depression transistor being coupled between the second and the fourth transistor and having a sixth gate supplied with a fourth control signal and a sixth gate insulating film; and
a timing control unit placed between a second power supply voltage terminal supplied with a second power supply voltage lower than the first power supply voltage and the reference voltage terminal, that generates the first control signal and the third control signal different from the first control signal corresponding to an inverted signal of an input signal, and generates the second control signal and the fourth control signal different from the second control signal corresponding to a non-inverted signal of the input signal,
wherein the timing control unit generates the third and the fourth control signal with a lower slew rate at a rising edge than those of the first and the second control signal, and generates the first and second control signals with a lower slew rate at a falling edge than those of the third and the fourth control signal.

2. The level shifter according to claim 1, wherein the timing control unit comprises:
a first timing control circuit that generates the first and the third control signal, and
a second timing control circuit that generates the second and the fourth control signal,
wherein the first timing control circuit includes:
a fifth and a sixth transistor coupled in series between the second power supply voltage terminal and the reference voltage terminal and each having a gate supplied with the input signal, and
a first resistor placed between the fifth and the sixth transistor,
wherein the second timing control circuit includes:
a seventh and an eighth transistor coupled in series between the second power supply voltage terminal and the reference voltage terminal and each having a gate supplied with an inverted signal of the input signal, and
a second resistor placed between the seventh and the eighth transistor,
wherein the first timing control circuit supplies a voltage at a node between the fifth transistor and the first resistor to the third transistor as the first control signal, and supplies a voltage at a node between the sixth transistor and the first resistor to the first depression transistor as the third control signal, and
wherein the second timing control circuit supplies a voltage at a node between the seventh transistor and the second resistor to the fourth transistor as the second control signal, and supplies a voltage at a node between the ninth transistor and the second resistor to the second depression transistor as the fourth control signal.

3. The level shifter according to claim 2, wherein each of the first and second resistors comprises a transfer gate.

4. The level shifter according to claim 3, wherein the third and the fourth gate insulating film is thinner than at least one of the first, the second, the fifth and the sixth gate insulating films.

5. The level shifter according to claim 1, wherein
the timing control unit comprises a first and a second timing control circuit,
wherein the first timing control circuit includes:
a fifth and a sixth transistor coupled in series between the second power supply voltage terminal and the reference voltage terminal, and each having a gate supplied with the input signal, and
a seventh and an eighth transistor coupled in series between the second power supply voltage terminal and the reference voltage terminal and each having a gate supplied with the input signal,
wherein the second timing control circuit includes:
a ninth and a tenth transistor coupled in series between the second power supply voltage terminal and the reference voltage terminal and each having a gate supplied with the inverted signal of the input signal, and
an eleventh and a twelfth transistor coupled in series between the second power supply voltage terminal and the reference voltage terminal and each having a gate supplied with the inverted signal of the input signal,
wherein the first timing control circuit supplies a voltage at a node between the fifth and the sixth transistor to the third transistor as the first control signal, and supplies a voltage at a node between the seventh and the eighth transistors to the first depression transistor as the third control signal, and
the second timing control circuit supplies a voltage at a node between the ninth and the tenth transistor the fourth transistor as the second control signal, and supplies a voltage at a node between the eleventh and the twelfth transistor to the second depression transistor as the fourth control signal.

6. The level shifter according to claim 5, wherein the fifth, the seventh, the ninth and the eleventh transistor comprises PMOS transistor, the sixth, the eighth, the tenth and the twelfth transistor comprises NMOS transistor,
wherein a driving capability of the fifth transistor is higher than a driving capability of the seventh transistor,
wherein a driving capability of the sixth transistor is lower than a driving capability of the eighth transistor,
wherein a driving capability of the ninth transistor is higher than a driving capability of the eleventh transistor, and
wherein a driving capability of the tenth transistor is lower than a driving capability of the twelfth transistor.

7. The level shifter according to claim 6, wherein the third and the fourth gate insulating film is thinner than at least one of the first, the second, the fifth and the sixth gate insulating films.

8. The level shifter according to claim 1, wherein
the timing control unit comprises:
   a fifth and a sixth transistor coupled in series between the second power supply voltage terminal and the reference voltage terminal and each having a gate supplied with the input signal, and a gate insulating film thinner than the first, the second, the fifth and the sixth gate insulating film,
   a first resistor placed between the fifth and the sixth transistor,
wherein the timing control circuit supplies a voltage at a node between the fifth transistor and the first resistor to the third transistor as the first control signal, supplies a voltage at a node between the sixth transistor and the first resistor to the first depression transistor as the third control signal, supplies an inverted signal of the first control signal to the second depression transistor as the fourth control signal, and supplies an inverted signal of the third control signal to the fourth transistor as the second control signal.

9. The level shifter according to claim 8, wherein the third and the fourth gate insulating film is thinner than at least one of the first, the second, the fifth and the sixth gate insulating films.

10. The level shifter according to claim 1, wherein
the timing control unit comprises:
   a fifth and a sixth transistor coupled in series between the second power supply voltage terminal and the reference voltage terminal, and each having a gate supplied with the input signal, and
   a seventh and an eighth transistor coupled in series between the second power supply voltage terminal and the reference voltage terminal and each having a gate supplied with the input signal,
   wherein the timing control circuit supplies a voltage at a node between the fifth and the sixth transistor to the third transistor as the first control signal, and supplies a voltage at a node between the seventh and the eighth transistors to the first depression transistor as the third control signal, and
   wherein the timing control circuit supplies a voltage at a node between the fifth and the sixth transistor to the third transistor as the first control signal, supplies a voltage at a node between the seventh and the eighth transistor to the first depression transistor as the third control signal, supplies an inverted signal of the first control signal to the second depression transistor as the fourth control signal, and supplies an inverted signal of the third control signal to the fourth transistor as the second control signal.

11. The level shifter according to claim 10, wherein the third and the fourth gate insulating film is thinner than at least one of the first, the second, the fifth and the sixth gate insulating films.

12. The level shifter according to claim 8, wherein the fifth, the seventh transistor comprises PMOS transistor, the sixth, the eighth transistor comprises NMOS transistor,
   wherein a driving capability of the fifth transistor is higher than a driving capability of the seventh transistor, and
   wherein a driving capability of the sixth transistor is lower than a driving capability of the eighth transistor.

13. A level shifter comprising:
   a first and a second transistor coupled to a first power supply voltage terminal supplied with a second power supply voltage in parallel, the first transistor including a first gate connected to a drain of the second transistor and a first gate insulating film, and the second transistor including a second gate connected to a drain of the first transistor and a second gate insulating film;
   a third and a fourth transistor coupled to a reference voltage terminal in parallel, the third transistor including a third gate supplied with a first control signal and a third gate insulating film, and the fourth transistor including a fourth gate supplied with a second control signal and a fourth gate insulating film;
   a first and a second depression transistor, the first depression transistor being coupled between the first and the third transistor and including a fifth gate supplied with a third control signal and a fifth gate insulating film, the second depression transistor being coupled between the second and the fourth transistor and including a sixth gate supplied with a fourth control signal and a sixth gate insulating film; and
   a timing control unit placed between a second power supply voltage terminal supplied with a second power supply voltage lower than the first power supply voltage and the reference voltage terminal, that generates the first control signal and the third control signal different from the first control signal corresponding to an inverted signal of an input signal, and generates the second control signal and the fourth control signal different from the second control signal corresponding to a non-inverted signal of the input signal.

14. The level shifter according to claim 13, wherein the third and the fourth gate insulating film is thinner than at least one of the first, the second, the fifth and the sixth gate insulating films.

15. The level shifter according to claim 13, wherein the timing control unit generates the third and the fourth control signal with a lower slew rate at a rising edge than those of the first and the second control signal, and generates the first and second control signals with a lower slew rate at a falling edge than those of the third and the fourth control signal.

16. The level shifter according to claim 13, wherein
the timing control unit comprises:
   a first timing control circuit that generates the first and the third control signal, and
   a second timing control circuit that generates the second and the fourth control signal,
   wherein the first timing control circuit includes:
      a fifth and a sixth transistor coupled in series between the second power supply voltage terminal and the reference voltage terminal and each including a gate supplied with the input signal, and
      a first resistor placed between the fifth and the sixth transistor,
   wherein the second timing control circuit includes:
      a seventh and an eighth transistor coupled in series between the second power supply voltage terminal and the reference voltage terminal and each including a gate supplied with an inverted signal of the input signal, and
      a second resistor placed between the seventh and the eighth transistor,
   wherein the first timing control circuit supplies a voltage at a node between the fifth transistor and the first resistor to the third transistor as the first control signal, and supplies a voltage at a node between the sixth transistor and the first resistor to the first depression transistor as the third control signal, and
   wherein the second timing control circuit supplies a voltage at a node between the seventh transistor and the second resistor to the fourth transistor as the second control signal, and supplies a voltage at a node between the ninth transistor and the second resistor to the second depression transistor as the fourth control signal.

17. The level shifter according to claim 13, wherein the timing control unit comprises a first and a second timing control circuit, wherein the first timing control circuit includes:
  a fifth and a sixth transistor coupled in series between the second power supply voltage terminal and the reference voltage terminal, and each including a gate supplied with the input signal, and
  a seventh and an eighth transistor coupled in series between the second power supply voltage terminal and the reference voltage terminal and each including a gate supplied with the input signal, wherein the second timing control circuit includes:
  a ninth and a tenth transistor coupled in series between the second power supply voltage terminal and the reference voltage terminal and each including a gate supplied with the inverted signal of the input signal, and
  an eleventh and a twelfth transistor coupled in series between the second power supply voltage terminal and the reference voltage terminal and each including a gate supplied with the inverted signal of the input signal, wherein the first timing control circuit supplies a voltage at a node between the fifth and the sixth transistor to the third transistor as the first control signal, and supplies a voltage at a node between the seventh and the eighth transistors to the first depression transistor as the third control signal, and the second timing control circuit supplies a voltage at a node between the ninth and the tenth transistor the fourth transistor as the second control signal, and supplies a voltage at a node between the eleventh and the twelfth transistor to the second depression transistor as the fourth control signal.

18. A level shifter comprising:
a first and a second transistor coupled to a reference voltage terminal in parallel, the first transistor including a first gate supplied with a first control signal and a first gate insulating film, and the second transistor including a second gate supplied with a second control signal and a second gate insulating film;

a first and a second depression transistor, the first depression transistor being coupled to the first transistor and including a fifth gate supplied with a third control signal and a fifth gate insulating film, the second depression transistor being coupled to the second transistor and including a sixth gate supplied with a fourth control signal and a sixth gate insulating film, the first and second depression transistors being connected to a first power supply voltage terminal supplied with a second power supply voltage in parallel; and a timing control unit that controls conduction states of the first and second transistors and the first and second depression transistors with different control signals including the first to the fourth control signals to prevent a voltage exceeding a withstand voltage being applied to the first and second transistors.

19. The level shifter of claim 18, wherein the timing control unit, placed between a second power supply voltage terminal supplied with a second power supply voltage lower than the first power supply voltage and the reference voltage terminal, generates the first control signal and the third control signal different from the first control signal corresponding to an inverted signal of an input signal, and generates the second control signal and the fourth control signal different from the second control signal corresponding to a non-inverted signal of the input signal.

20. The level shifter of claim 18, further comprising a third and a fourth transistor coupled to the first power supply voltage terminal supplied with the second power supply voltage in parallel, the third transistor including a third gate connected to a drain of the fourth transistor and a third gate insulating film, and the fourth transistor including a fourth gate connected to a drain of the third transistor and a fourth gate insulating film, wherein the first and the second gate insulating film is thinner than the third, the fourth, the fifth and the sixth gate insulating film.

21. The level shifter according to claim 18, wherein the timing control unit generates the third and the fourth control signal with a lower slew rate at a rising edge than those of the first and the second control signal, and generates the first and second control signals with a lower slew rate at a falling edge than those of the third and the fourth control signal.

* * * * *